United States Patent [19]
Boeck et al.

[11] Patent Number: 5,880,018
[45] Date of Patent: Mar. 9, 1999

[54] METHOD FOR MANUFACTURING A LOW DIELECTRIC CONSTANT INTER-LEVEL INTEGRATED CIRCUIT STRUCTURE

[75] Inventors: Bruce Allen Boeck; Jeff Thomas Wetzel; Terry Grant Sparks, all of Austin, Tex.

[73] Assignee: Motorola Inc., Austin, Tex.

[21] Appl. No.: 727,159

[22] Filed: Oct. 7, 1996

[51] Int. Cl.⁶ .................................................. H01L 21/441
[52] U.S. Cl. .......................... 438/619; 438/700; 438/633; 438/623
[58] Field of Search .................. 438/619, 622, 438/623, 627, 633, 700

[56] References Cited

U.S. PATENT DOCUMENTS

| | | |
|---|---|---|
| 4,832,789 | 5/1989 | Cochran et al. . |
| 4,954,214 | 9/1990 | Ho . |
| 4,987,101 | 1/1991 | Kasnta et al. . |
| 5,310,700 | 5/1994 | Lin et al. . |
| 5,407,860 | 4/1995 | Stoltz et al. ............................ 437/180 |
| 5,510,293 | 4/1996 | Numata . |
| 5,518,959 | 5/1996 | Jang et al. . |
| 5,559,055 | 9/1996 | Chang et al. ............................ 437/195 |
| 5,641,712 | 6/1997 | Grivna et al. . |
| 5,677,241 | 10/1997 | Manning . |
| 5,691,573 | 11/1997 | Avanzino et al. . |
| 5,773,361 | 6/1998 | Cronin et al. ............................ 438/637 |

FOREIGN PATENT DOCUMENTS

| | | |
|---|---|---|
| 0 684 642 A1 | 11/1995 | European Pat. Off. ...... H01L 21/768 |
| 0 701 277 A2 | 3/1996 | European Pat. Off. ...... H01L 21/768 |
| 0 703 611 A1 | 3/1996 | European Pat. Off. ...... H01L 21/768 |
| 0 706 215 A2 | 4/1996 | European Pat. Off. ...... H01L 23/532 |
| 0 706 215 A2 | 11/1996 | European Pat. Off. ...... H01L 23/532 |
| 0 706 215 A3 | 11/1996 | European Pat. Off. ...... H01L 23/532 |
| WO 87/04858 | 8/1987 | WIPO ............................ H01L 21/90 |
| WO 96/19830 | 6/1996 | WIPO ........................... H01L 23/532 |

OTHER PUBLICATIONS

G. Minamihaba et al., "Double–Level Cu Inlaid Interconnects With Simultaneously Filled Via–Plugs", 2419A Int'l. Conf. on Solid State Devices & Materials, Aug. 21–24, 1995, pp. 97–99.

Yoshio Homma et al., Low Permittivity Organic Dielectrics for Multilevel Interconnection in High Speed ULSIs, Extended Abstracts of the 1995 Int'l. Conf. on Solid State Devices & Materials, pp. 154–156.

Yoshio Homma et al., "Low Permittivity Organic Dielectrics for Multilevel Interconnection in High Speed ULSIs", 2419A Int'l. Conf. on Solid State Devices and Materials, Aug. 21–24, 1995, pp. 154–156.

Partial European Search Report and Annex, EP 97 11 6851.

*Primary Examiner*—Caridad Everhart
*Attorney, Agent, or Firm*—Keith E. Witek; Kent J. Cooper

[57] ABSTRACT

An interconnect structure having a dielectric layer with low dielectric constant is formed within an integrated circuit. In one embodiment of the invention, portions of a silicon dioxide layer (18) lying adjacent to a conductive interconnect (21) are removed to expose portions of a silicon nitride etch stop layer (16). A dielectric layer (22) having a low dielectric constant is then formed overlying the conductive interconnect (21) and the exposed portions of the silicon nitride etch stop layer (16). A portion of the dielectric layer (22) is then removed to expose the top surface of the conductive interconnect (21) to leave portions of the dielectric layer (22) between adjacent conductive interconnects (21). The resulting interconnect structure has reduced crosstalk between conductive interconnects (21) while avoiding prior art disadvantages of reduced thermal dissipation and increased mechanical stress.

50 Claims, 5 Drawing Sheets

METHOD FOR MANUFACTURING A LOW DIELECTRIC CONSTANT INTER-LEVEL INTEGRATED CIRCUIT STRUCTURE

FIELD OF THE INVENTION

The present invention relates generally to semiconductor manufacturing, and more particularly, in forming low dielectric constant regions between metallic members to reduce capacitive coupling and cross-talk.

BACKGROUND OF THE INVENTION

Modern integrated circuits contain thousands of semiconducting devices on a single chip and as the device density of a given chip increases more layers of metallization are required to interconnect the devices. Moreover, within a given metal layer, the horizontal distance separating metallization lines must be reduced in order to minimize the chip size as integrated circuit device density increases. At the same time, metallization resistance and capacitance must be minimized in order to meet the chip's speed and performance requirements. Traditionally, the inter-level dielectrics used to isolate metallization lines within a same level and metallization lines in two different levels have been performed using materials with high dielectric constants. For example, undoped and doped silicon dioxide layers such as borophosphosilicate glass (BPSG), phosphosilicate glass (PSG), and plasma and chemical vapor deposited tetraethylorthosilicate based (TEOS) oxides have been used as dielectric layers in these multi-metallization structures. The semiconductor industry's continuing demand for integrated circuits with ever increasing device densities and operating speeds requires new dielectric materials having low dielectric constants in order to reduce cross-talk, capacitive coupling, and resulting speed degradation.

However, many of the low dielectric constant materials which are used to form inter-level and inter-metal dielectric layers are difficult to work with because of their poor mechanical strength. In addition, many of these materials have processing temperature limitations, i.e., they cannot be exposed to thermal processing over a certain temperature once formed on an integrated circuit. In addition, many of these materials also provide poor thermal conductivity. Therefore, heat generated during high frequency operation cannot be effectively dissipated from the integrated circuit whereby circuit reliability becomes a problem. Accordingly, a need exists for a method for forming an interconnect structure with a dielectric layer having a low dielectric constant whereby mechanical strength disadvantages are reduced, and thermal dissipation is improved.

BRIEF DESCRIPTION OF THE DRAWINGS

It will be appreciated that for simplicity and clarity of illustration, elements illustrated in the FIGURES have not necessarily been drawn to scale. For example, the dimensions of some of the elements are exaggerated relative to other elements for clarity. Further, where considered appropriate, reference numerals have been repeated among the FIGURES to indicate corresponding or analogous elements.

DESCRIPTION OF A PREFERRED EMBODIMENT

Generally, the present invention involves a method for forming an interconnect structure in an integrated circuit (IC) wherein RC time delays or cross-talk between adjacent metal lines is reduced. In one embodiment of the invention, an interconnect structure is formed using a first dielectric layer with a high dielectric constant and a second dielectric layer with a low dielectric constant. In this embodiment of the invention, the dielectric layer having a low dielectric constant is formed predominantly between conductive interconnects and not substantially over the conductive interconnects. The low-K dielectric material is formed in this manner after a sacrificial higher-K dielectric layer between the interconnects has been removed to provide areas between conductive members which can be filled low-K dielectric material whereby low-K dielectric material over the conductive members is reduced or eliminated. This select placement of low-K material to between conductive regions instead of overlying or underlying conductive member improves thermal dissipation and mechanical strength while preserving the advantage of improved isolation associated with the low-K material.

In another embodiment of the invention, an interconnect structure having reduced cross-talk or RC time delays is formed by etching a first dielectric layer to form a contact opening. A second dielectric layer is then deposited wherein the second dielectric layer has a low dielectric constant. The second dielectric layer is deposited such that the contact opening in the first dielectric layer is sealed to form an air region (e.g., the second dielectric can be a low-K spin-on-resin with a stiff polymer backbone). A portion of the second dielectric layer is then removed to expose the contact opening previously sealed by the second dielectric layer. A dual in-laid metal interconnect is then formed within the contact opening whereby the low-K second dielectric is positioned between conductive regions where isolation benefits are achieved while thermal and mechanical properties are improved.

In an alternative embodiment of the invention, void/air regions are formed between adjacent conductive metal interconnect lines by spinning on a polymeric resin having a stiff polymer backbone. This stiff backbone material forms air regions between closely spaced metal conductive members within the same conductive interconnect layer. Depending upon the atomic gas content of the air gaps and atmospheric pressure of formation, the air gaps will approach a dielectric constant $\epsilon=1$ which is the optimal dielectric constant for reduction of cross-talk and adverse capacitive coupling in polysilicon and metal interconnects.

In yet another embodiment of the invention, a nonconformal dielectric layer is formed overlying adjacent conductive interconnect lines such that a void/air region is formed between closely-spaced conductive interconnect lines within the same conductive inter-connect level. A second dielectric layer is then formed overlying the nonconformal dielectric layer and planarized to form a completed inter-level dielectric. The second dielectric layer and the non-conformal conductive layer are then patterned to form a contact or via opening which is then filled with conductive material to form a conductive interconnect. The void region between the two adjacent conductive interconnect lines reduces cross-talk/capacitance between the two conductive interconnect lines so that circuit speed is improved and logical cross-talk errors are avoided.

The embodiments of the present invention can be further understood with reference to FIGS. 1–16.

Figure 1:
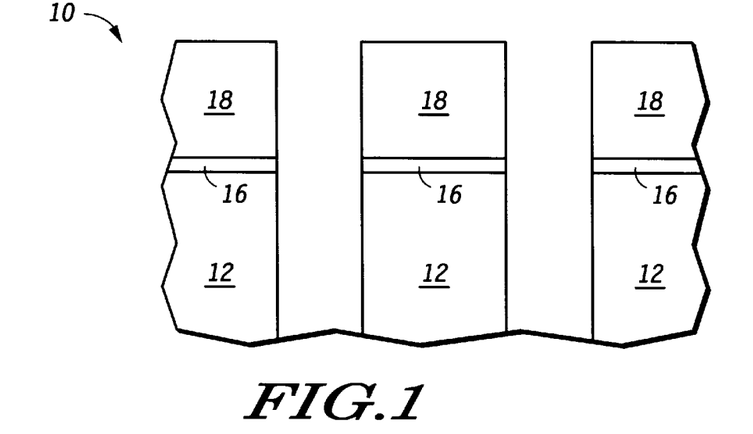
FIGS. 1–6 illustrate, in cross-sectional diagrams, process steps for making an interconnect structure in accordance with one embodiment of the invention.

FIGS. 1–6 illustrate, in cross-sectional form, process steps for making an interconnect structure in accordance with a first embodiment of the invention. Shown in FIG. 1 is a portion 10 of an integrated circuit structure comprising a first dielectric layer 12, an etch stop layer 16, and a second dielectric layer 18. In FIG. 1, first dielectric layer 12, etch stop layer 16, and second dielectric layer 18 are patterned using conventional lithographic and etching techniques. In a preferred embodiment, first dielectric layer 12, etch stop layer 16, and second dielectric layer 18 are simultaneously patterned and etched using a plasma etch chemistry comprising a fluorinated etch species. For example, the layers 12, 16, and 18 may be patterned in a plasma environment which is generated using etch gases such as $CHF_3$, $CF_4$, $C_2F_6$ and/or the like. It is important to note that this etch process defines a contact opening 14 within first dielectric layer 12 which allows a metallic conductive layer to be subsequently deposited within the contact opening of FIG. 1 to form a conductive contact portion 14. This subsequently deposited conductive layer is used to make electrical contact/interconnection to an underlying conductive region such as another metal layer or a doped semiconductive region within polysilicon layer or the semiconductor substrate. The doped region may be a bipolar electrode, a well contact, a source/drain, a thin film transistor (TFT) node or a like doped polysilicon or substrate portion. Polysilicon may be replaced with amorphous silicon, epitaxially grown silicon, or refractory silicided silicon-containing layers.

In one embodiment, first dielectric layer 12 and second dielectric layer 18 are formed using the same material. For example, first dielectric layer 12 and second dielectric layer 18 may be a layer of borophosphosilicate glass (BPSG), layers of plasma tetraethylorthosilicate (TEOS), phosphosilicate glass (PSG) layers, silicon dioxide, nitride layers, fluorinated oxide layers, or like dielectric materials. In another form, the dielectric layer 18 may be made of a different material from layer 12. First dielectric layer 12, second dielectric layer 18 are formed using conventional plasma deposition processes, low pressure chemical vapor position (LPCVD) processes, or the like. In one embodiment, etch stop layer 16 is a layer of plasma enhanced silicon nitride when the layers 12 and 18 are oxide. Alternatively, etch stop layer 16, which can also function as an anti-reflective coating (ARC) used in lithographic processing, may be a layer of silicon rich silicon nitride, aluminum nitride, or any dielectric layer which can be used as an etch-back stopping layer or a chemical mechanical polishing (CMP) stop layer. Also, silicon oxide nitride (SiON) or silicon rich SiON may be used as an etch stop or anti-reflective coating (ARC) layer herein.

Figure 2:
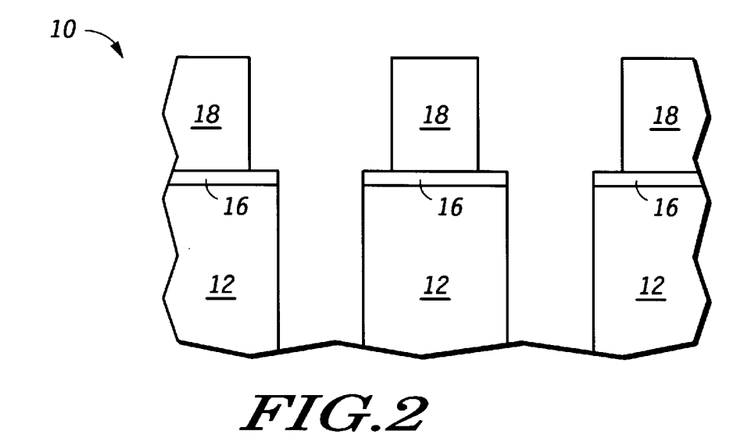

In FIG. 2, another photoresist and etch process is used to form interconnect trenches within layer 18. The openings through layer 12 in FIG. 1 are contact openings to underlying material whereas the opening formed through layer 18 in FIG. 2 is an interconnect trench. To form the interconnect trenches of an in-laid metal (damascene) process, the second dielectric layer 18 is etched selective to etch stop layer 16 using an etch chemistry environment. This etch process defines an interconnect region 20 within second dielectric layer 18. It is important to note that dual in-laid metal processing can be performed in other similar ways than that illustrated in FIGS. 1–2. FIGS. 1–2 are intended to be representative of any method for forming dual in-laid structures having contact areas and interconnect trenches.

Figure 3:
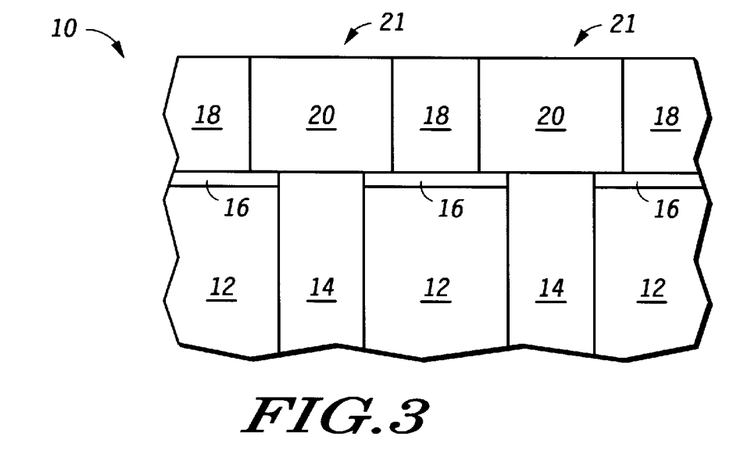

In FIG. 3, a conductive layer of material is then deposited within contact portion 14 and interconnect portion 20. This conductive layer of material is subsequently planarized by CMP and/or etch processing to form conductive interconnects 21. In one embodiment, conductive interconnects 21 are formed by first depositing a thin barrier layer within contact portion 14 and interconnect portion 20 followed by a thicker conductive layer which more completely fills conductive portion 14 and interconnect portion 20. It should be appreciated that interconnect 21 may be formed using conventional chemical mechanical polishing (CMP) techniques, resist etch back (REB) techniques, and/or timed plasma etch processing. Any layer or composite layer comprising titanium nitride, titanium tungsten, titanium, tantalum, tantalum nitride, tantalum silicon nitride, titanium silicon nitride, tungsten nitride or other like material may be used as barrier layers for the portions 14 and 20. In addition it should be appreciated that copper, gold, silver, tungsten, aluminum, any composite thereof, or the like may be used as the thicker fill materials to form interconnect 21 over the barrier layer(s). Moreover, conductive interconnect 21 may be formed using conventional chemical vapor deposition (CVD) techniques, electrode plating techniques, sputtering techniques, and/or selective deposition techniques.

Figure 4:
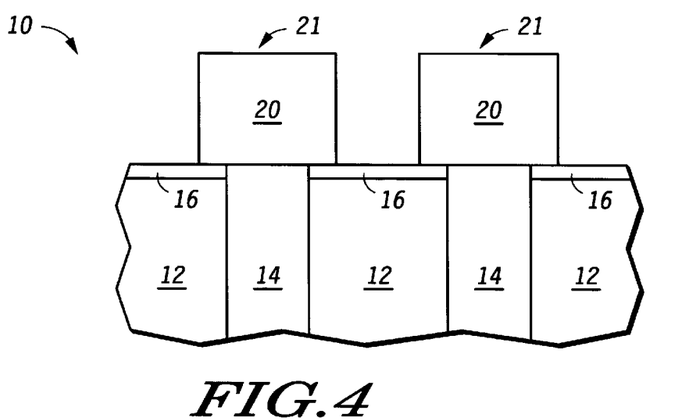

In FIG. 4, the remaining portions of second dielectric layer 18 (referred to as sacrificial dielectric layer portions) are selectively removed to expose portions of etch stop layer 16. It should be appreciated that the remaining portions of dielectric layer 18 may be removed using conventional plasma and/or wet etching techniques. In one embodiment the remaining portions of dielectric layer 18 are removed using buffered HF solution. Alternatively, the remaining portions of dielectric layer 18 may be removed using the same etch process used to define interconnects 21.

Figure 5:
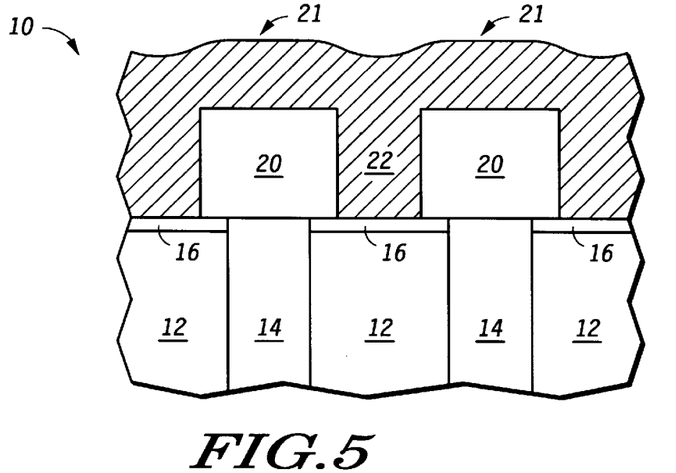

In FIG. 5, a third dielectric layer 22 having a low dielectric constant $\epsilon$ is then formed over conductive interconnects 21.

Adequate low-K dielectrics for use herein are such that $\epsilon \leq 3.5$. Even more reduction in cross-talk and capacitive coupling will result when a low-K dielectric having $\epsilon \leq 3.0$ is utilized. Preferably, from a capacitive-reduction standpoint, materials with $\epsilon \leq 2.7$ are optimal as inter-level dielectrics. Third dielectric layer 22 maybe formed using conventional spin-on techniques or chemical vapor deposition techniques. Spin-on polymers or spin on glasses (SOGs) which are best used for the layer 22 are hydrogen silsesquioxane (HSQ), benzocyclobutene (BCB), polyimide, and polyarylether (PAE). For example, in one embodiment, dielectric layer 22 has a dielectric constant of approximately $\epsilon = 3.0$ and is a spin-on glass material such as HSQ. Alternatively, dielectric layer 22 may be a thermal setting resin such as BCB which has a dielectric constant of approximately $\epsilon = 2.6$. Alternatively, dielectric layer 22 may be a polyaryl ether such as PAE or PAE2 having a dielectric constant of approximately $\epsilon = 2.6$. It is important to note that any dielectric having $\epsilon \leq 3.5$ can be utilized to improve capacitance and cross-talk of TEOS or silicon dioxide which has a dielectric constant within the range of 3.9 to 4.3. Layer 22 may be an organic spin-on dielectric or organic dielectric layer formed by a CVD technique.

Figure 6:
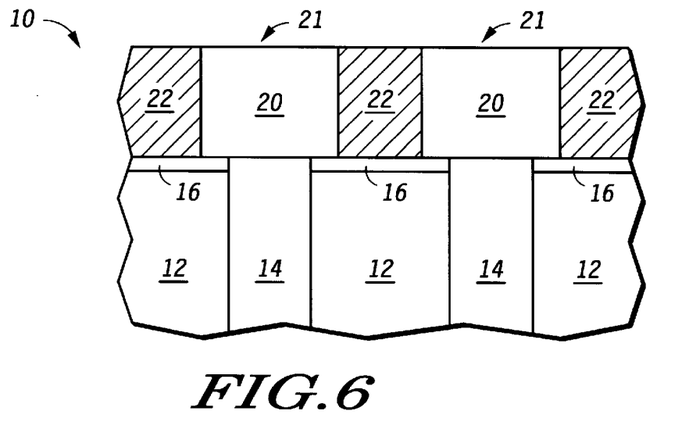

In FIG. 6, dielectric 22 is then planarized to expose a top portion of conductive interconnects 21. Typically, the portion of interconnect 21 which is exposed is a top portion of the conductive interconnect portion 20 as illustrated in FIG. 6. In a preferred embodiment, dielectric layer 22 is planarized using conventional plasma etching techniques and/or chemical mechanical polishing. As shown in FIG. 6, this planarization results in a formation of an interconnect structure having a low dielectric constant dielectric layer 22 ($\epsilon \leq 3.5$) overlying another dielectric layer 12 and 16 having a higher dielectric constant ($\epsilon > 3.5$). In addition, layer 22 and/or top portions of the conductive interconnects of FIG. 6 may be covered by an optional anti-reflective coating (ARC) layer. It should be appreciated that dielectric layer 22 which has a low dielectric constant improves circuit performance because capacitance between adjacent interconnect lines is reduced by lower-K films. Due to the fact that layer 22 does not cover the entire surface of the wafer (e.g. top portions of 20 are not covered by layer 22 in FIG. 6), mechanical stability is improved and thermal properties are increased for the integrated circuit. If copper is used as a conductive interconnect in FIG. 6, then a capping/barrier layer may be needed on top of the structure of FIG. 6 to isolate the copper from overlying materials.

Figure 7:
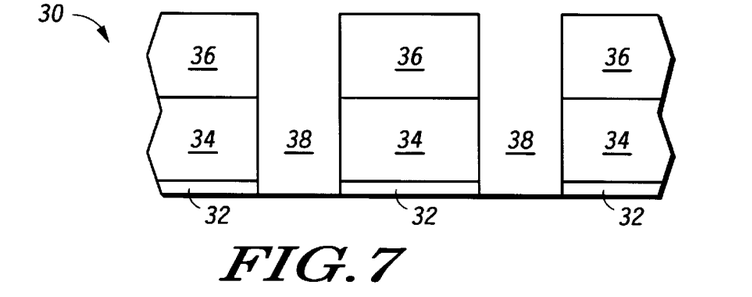
FIGS. 7–10 illustrate, in cross-sectional diagrams, process steps for making an interconnect structure in accordance with an alternative of embodiment of the invention.

FIG. 7–10 illustrate, in cross-sectional form, process steps for making an interconnect structure in accordance with an alternative embodiment of the invention. Shown in FIG. 7 is a portion 30 of an integrated circuit structure comprising an etch stop layer 32, a first dielectric layer 34, and a photoresist layer 36. Using conventional photolithographic patterning and etch techniques, etch stop layer 32 and first dielectric layer 34 are etched to form a contact portion 38 within first dielectric layer 34 and to expose an underlying conductive region (not illustrated in FIG. 7) such as a metal interconnect, polysilicon, or doped silicon region. Layer 32 is formed using conventional plasma or chemical vapor deposition techniques and may be a layer of silicon nitride, silicon rich-silicon nitride or aluminum nitride and functions as an etch stop layer (ESL) and/or an anti-reflective coating (ARC) layer. First dielectric layer 34 is also formed using conventional chemical vapor deposition (CVD) techniques such as plasma deposition, low pressure chemical vapor deposition (LPCVD) and the like and may be a layer of BPSG, PSG, TEOS, fluorinated oxide, or like dielectric materials or composite layers.

Figure 8:
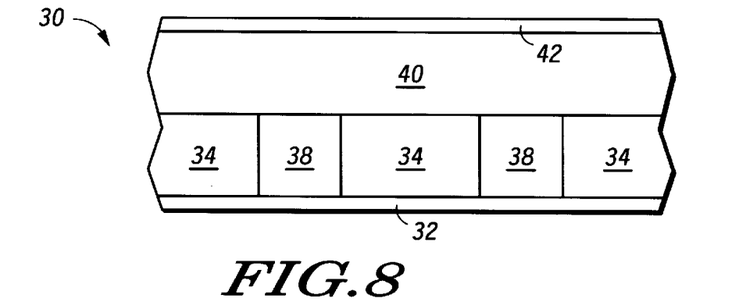

In FIG. 8, photoresist mask 36 is removed and a dielectric layer 40 having a low dielectric constant is formed over dielectric layer 34 such that contact portion 38 is capped or bridged by dielectric layer 40 and left unfilled (i.e., an air gap 38 is formed in FIG. 8 from the contact portion 38 of FIG. 7). An anti-reflective coating (ARC) layer 42 which also serves as a hard mask is then deposited over dielectric layer 40. In a preferred embodiment, dielectric layer 40 has a dielectric constant $\epsilon$ of 3.0 or less, but can be any material less than $\epsilon \approx 3.5$ to confer electrical isolation benefits between adjacent conductive members. In one embodiment, dielectric layer 40 is polyphenylquinoxaline (PPQ) and has a dielectric constant of $\epsilon = 3.0$. Alternatively, dielectric layer 40 may be a layer of polyimide having a dielectric constant of $\epsilon = 2.6$. The polyimide may be formed from either a poly(amic) acid solution or a fully imidized polyimide in FIG. 8. In general, the spin-on material used in FIG. 8 to make the layer 40 can be any material which has a substantially stiff polymer backbone so that the air regions 38 are at least partially formed in FIG. 8.

To avoid blistering of the air gap 38 of FIG. 8, an anneal step of the layer 40 should be performed in a thermal ramp manner. The ramp should start at less than 100° C. and arrive, after a selected temperature ramp time period, at roughly 100° C. to 300° C. for solvent-removal annealing of the layer 40. A slower ramp thermal process will be more likely to avoid any blistering of the air gap 38 than a fast exposure to high temperatures. Also, a sub-atmospheric spin-on process can be used to create air gaps 38 with reduced pressure or fewer trapped molecules/atoms. This sub-atmospheric process can reduce blistering effects by eliminating a high density of atoms within the gap 38.

Figure 9:
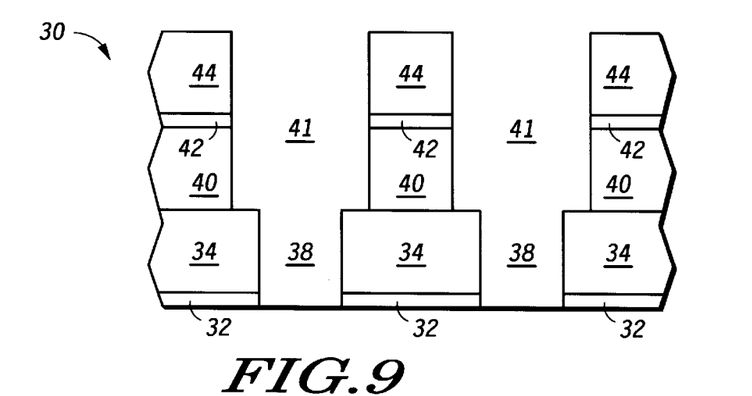

In FIG. 9, conventional photolithographic patterning and etching techniques are then used to pattern and etch reflective layer 42 and dielectric layer 40 to define interconnect portion 41 within dielectric layers and to re-expose contact portion 38 which are the air gaps 38 in FIG. 8. It is important to note that additional etching is not required to form a contact opening to an underlying metal interconnect or doped silicon region since the air gaps 38 were isolated in FIG. 8. In one embodiment, dielectric layer 40 is patterned using a plasma comprising oxygen, and photoresist mask 44 used to define the opening within dielectric layer 40 is removed at the same time that dielectric layer 40 is etched. Therefore, in this embodiment the etch process used to pattern dielectric layer 40 also simultaneously removes some or all of the photoresist mask 44 used to define the opening within dielectric layer 40.

Figure 10:
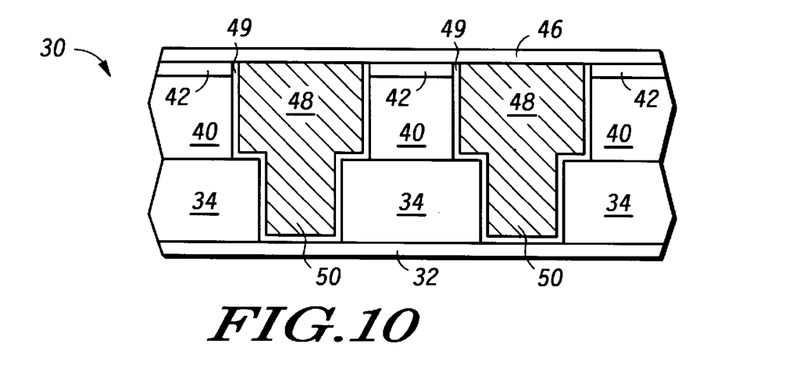

In FIG. 10, a barrier layer 49 and a conductive film material are then formed within contact opening 38 and interconnect region 41. A portion of the barrier layer 49 and the conductive film material are then selectively removed to form conductive interconnects 48 of FIG. 10. In one embodiment, conductive interconnects 48 are formed using conventional plasma etching techniques. Alternatively, connective interconnects 48 may be formed using conventional chemical mechanical polishing (CMP) techniques. An etch stop layer 46 or anti-reflective coating (ARC) layer 46 is then formed overlying dielectric 40 and conductive interconnects 48. It should be appreciated that the process steps illustrated in FIGS. 7–10 may then be repeated in order to form an additional set of conductive interconnects overlying conductive interconnects 48 and thus, integrated circuits having multiple layers of interconnects can be formed with the present invention. Since the high-K or high dielectric constant material 40 is: (1) located only between regions 48 where isolation advantages result; and (2) not located over the entire wafer to degrade mechanical stability and thermal dissipation, the final structure of FIG. 10 has advantages over the prior art.

Figure 11:
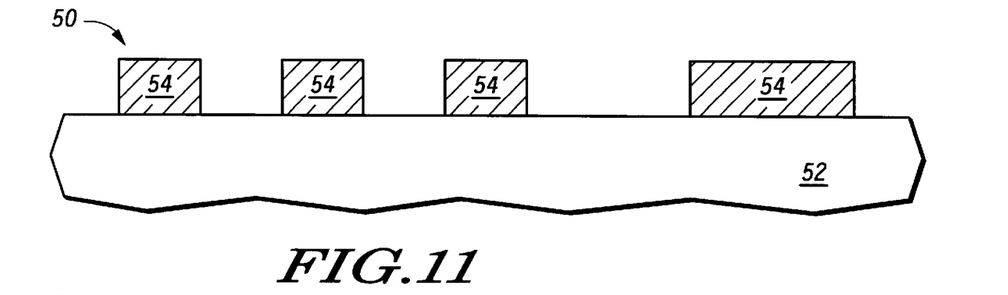
FIGS. 11–15 illustrate, in cross-sectional diagrams, process steps for making an interconnect structure in accordance with yet another alternative embodiment of the invention.

FIGS. 11–15 illustrate cross-sectional process steps for making an interconnect structure in accordance with an alternative embodiment of the invention. Shown in FIG. 11 is a portion 50 of an integrated circuit structure comprising a first dielectric layer 52 and a plurality of conductive interconnects 54. First, dielectric layer 52 is formed using conventional plasma or chemical vapor deposition (CVD) techniques and may be a layer of BPSG, PSG, TEOS, fluorinated silicon oxide, or the like. The plurality of conductive interconnects 54 are also formed using conventional photolithographic patterning and etching techniques. The plurality of conductor interconnects 54 may be formed using doped silicon dioxide, metals, metal salicides or the like.

Figure 12:
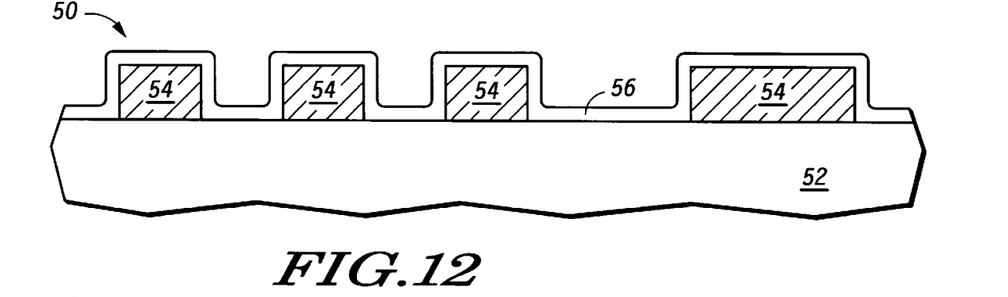
Figure 13:
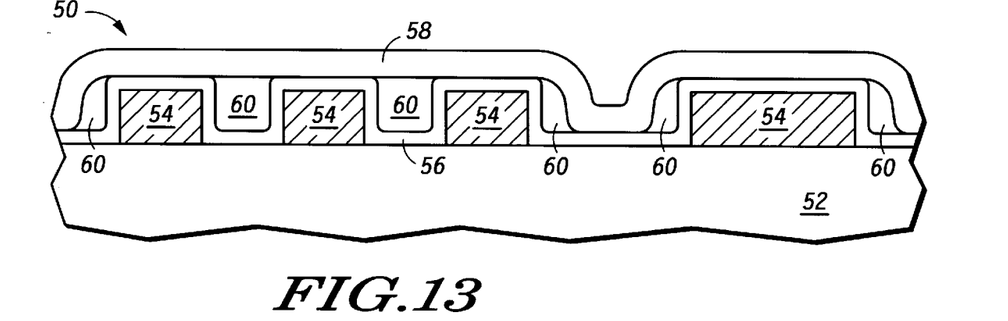
Figure 14:
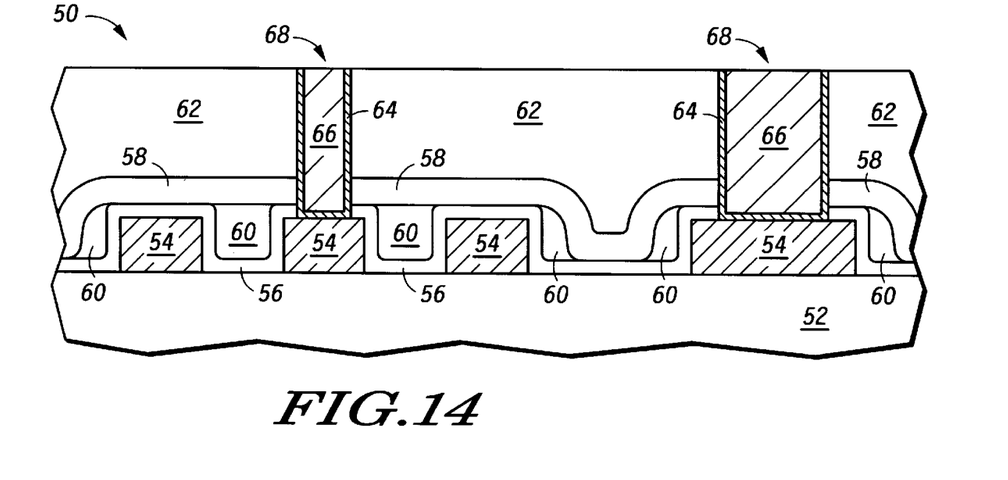

In FIG. 12, an optional etch stop layer 56 is then formed overlying first dielectric layer 52 and overlying the plurality of conductive interconnects 54. The optional etch stop layer 56 is formed using conventional plasma or low pressure chemical vapor deposition techniques and may be silicon dioxide, silicon nitride, silicon oxynitride, or aluminum nitride. Silicon dioxide is preferred for layer 56 and layer 56 may be etched to form sidewall spacers in FIG. 12. The layer 56 is also used to compensate for contact misalignment to the regions 54. If the air regions 60 of FIG. 13 are exposed to contact openings as illustrated in FIG. 14 and a highly conformal metallic depositions process is used, the electrical short circuiting may result. To avoid this electrical short circuit problem, the spacers or layer 56 provides the additional benefit of compensating for photolithographic contact alignment so that the air gaps are either not exposed or not substantially exposed resulting is metal deposition problems.

In FIG. 13, a second dielectric layer 58 having a low dielectric constant is formed overlying etch stop layer 56 to form air gaps 60 between portions of etch stop layer 56 and second dielectric layer 58. More specifically, as shown in FIG. 13, air gap 60 are formed between conductive interconnects 54 that are closely spaced to one another where "closely-spaced" is a function of the stiffness of the polymer backbone of the spin on resin used for layer 58. In addition, air gap 60 may also be formed along the sidewalls of a given conductive interconnect 54, as also illustrates in FIG. 12, thereby forming air spacers. In one embodiment, dielectric 58 is PPQ having a dielectric constant of less than or equal to 3.5. After layer 58 is spun on to etch stop layer 56, dielectric layer 58 is annealed at a temperature ranging from 100°–250° C. for approximately 30 minutes. Alternatively, dielectric layer 58 may be a pre-imidized polyimide having a dielectric constant less than or equal to 3.0. Thermal ramp processing or sub-atmospheric deposition may be used to avoid or at least reduce any blistering of the air gaps 60 of FIG. 13.

In FIG. 14, a third dielectric layer 62 is then formed overlying second dielectric layer 58. Dielectric layer 62 may be formed using conventional plasma or low pressure chemical vapor deposition techniques and may be a layer of BPSG, PSG, TEOS, silane, fluorinated silicon oxide, a composite dielectric, or like dielectric layer(s). Conventional photolithographic and patterning techniques are then used to form via openings extending through third dielectric layer 62, second dielectric layer 58, and etch stop layer 56 to expose a portion of an underlying conductive interconnect 54. Layer 56 provides mis-alignment yield enhancement as previously discussed with respect to FIG. 12. A barrier layer 64 is then formed within via openings and a conductive fill material 66 is then formed overlying the barrier layer 64. A portion of barrier layer 64 and conductive fill material 66 are then selectively removed to form conductive vias 68 with via openings. Barrier layer 64 may be a composite of titanium and titanium nitride or a layer of tantalum nitride, a layer of tungsten nitride or the like as previously discussed herein. Conductive fill material 66 is formed using conventional deposition techniques and may be a layer of copper, tungsten, aluminum or a like conductor or composite conductive layer.

Figure 15:
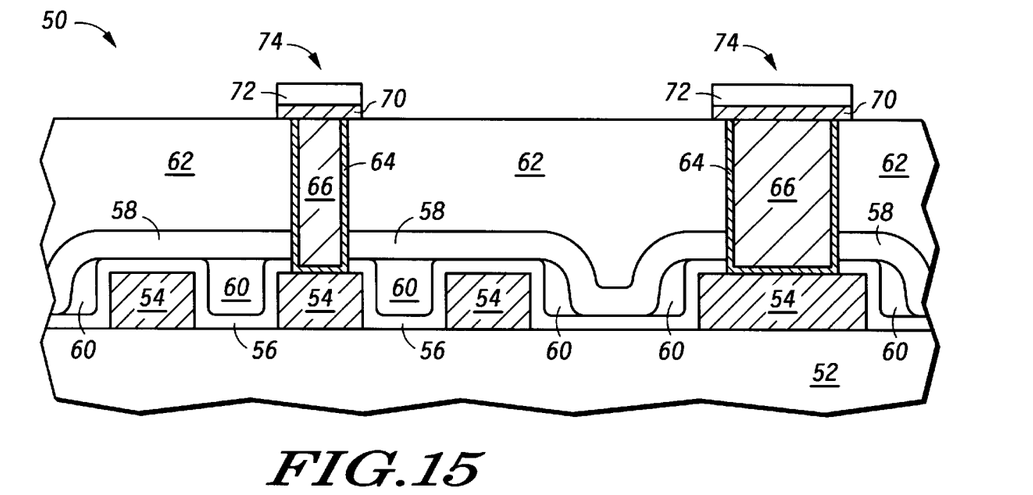

In FIG. 15, a barrier layer 70 and a conductive material layer 72 are then formed overlying conductive vias 68. Barrier layer 70 and conductive layer material 72 are then patterned using conventional photolithographic and etching techniques to form conductive interconnects 74. Barrier layer 70 is formed using conventional techniques and may be a composite layer of titanium and titanium nitride or a layer of tungsten nitride, tantalum nitride or the like. Similarly, conductive layer material 72 is formed using conventional deposition techniques and may be a layer of tungsten, aluminum, copper, silver, gold, or the like.

Figure 16:
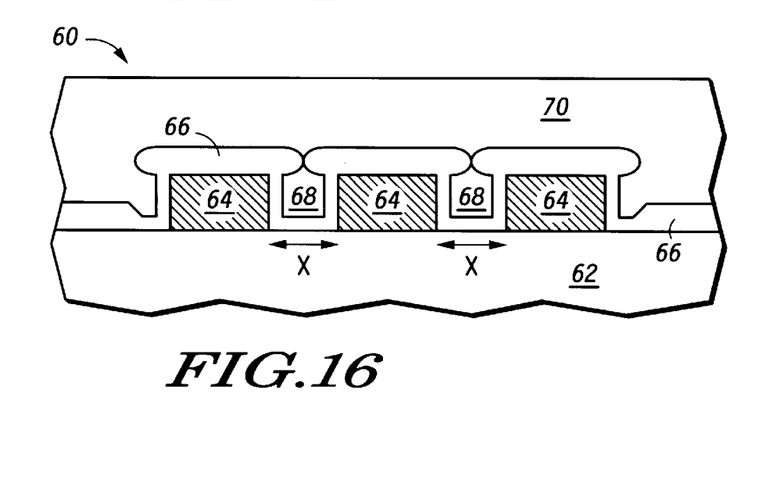
FIG. 16 illustrates, in a cross-sectional diagram, an interconnect structure wherein air gaps are formed by a material deposited via a non-conformal deposition process in accordance with one embodiment of the invention.

FIG. 16 illustrates in cross-section an interconnect structure in accordance with an alternative embodiment of the invention. Shown in FIG. 16 is a portion 60 of an integrated circuit comprising a first dielectric layer 62, a non-conformal dielectric layer 66, a plurality of conductive interconnect 64 and a third dielectric layer 70. First dielectric layer 62 is formed overlying a semiconductor substrate using conventional techniques. First dielectric layer 62 may be a layer of BPSG, a layer of PSG, a layer of fluorinated oxide, or the like. The plurality of conductive interconnect lines 64 are formed using conventional photolithographic and etching techniques. The plurality of conductive interconnect lines 64 may be formed using doped polysilicon, aluminum, tungsten, metal silicide or a composite of polysilicon and metal silicide or the like.

As shown in FIG. 16, at least two of the plurality of conductive interconnect lines 64 are separated by a distance X. Non-conformal dielectric layer 66 is then formed overlying the plurality of conductive interconnect lines 64 such that a sealed void region 68 is formed between at least two of the conductive interconnect lines within the plurality of conductive interconnect lines 64. Sealed void regions 68 spans at least 60% of the first distance X which separates two adjacent conductive interconnect lines 64. It should be appreciated that non-conformal dielectric layer 66 may be deposited such that sealed void region 68 spans 70%, 80%, or 90% of the first distance X. In a preferred embodiment, non-conformal dielectric layer 66 is deposited using silane as a source gas in a plasma enhanced chemical vapor deposition (CVD). Alternatively, other source gases which enhance non-conformal deposition may also be used. A third dielectric layer 70 is then formed overlying non-conformal dielectric layers 66 and planarized using conventional techniques. In one embodiment, third dielectric layer 70 is planarized using conventional chemical mechanical polishing (CMP) techniques. Alternatively, third dielectric layer 70 may also be planarized using conventional plasma etching techniques. As shown in FIG. 16, the resulting interconnect structure has void regions between close adjacent conductive interconnect lines where improved isolation is usually needed. These void regions have a dielectric constant of approximately 1.0 in a preferred form and thus reduce RC time delays or cross-talk between adjacent conductive interconnect lines 64 which are closely spaced.

Thus it is apparent that there has been provided, in accordance with the present invention, several structures and methods which can be used to reduce cross-talk and capacitive coupling in metallic members overlying an integrated circuit substrate. Although the invention has been described and illustrated with reference to the specific embodiment, it is not intended that the invention be limited to these illustrative embodiments. Those skilled in the art will recognize that modifications and variations may be made with departing from the spirit and scope of the invention. For example, layer 16 and 12 of FIG. 4 can be trenched after formation of the layer 20 so that layer 22 of FIG. 6 plugs an opening which is slighter deeper than that currently illustrated in FIG. 4. This deeper region can further improve isolation between elements 20. Therefore, it is intended that this invention encompass all variations and modifications as fall within the scope of the appended claims.

What is claimed is:

1. An method for forming a semiconductor device, the method comprising the steps of:

forming a first dielectric layer having a first trench region and a second trench region separated from the first trench region;

forming a first conductive region in the first trench region and a second conductive region in the second trench region using a first planarization process, the second conductive region being laterally separated from the first conductive region wherein the first and second conductive regions are separated by an intermediate portion of the first dielectric layer;

removing the intermediate portion of the first dielectric layer to form a gap between the first and second conductive regions;

forming a second dielectric layer having a dielectric constant $\epsilon$ wherein $\epsilon \leq 3.5$ overlying the first and second conductive regions, the second dielectric layer having a first portion which fills the gap; and polishing a top portion of the dielectric layer to expose a top surface of at least one of the first conductive region or the second conductive region wherein the first portion of the second dielectric layer remains within the gap.

2. The method of claim 1 wherein the step of forming the second dielectric layer comprises:

forming the second dielectric layer as an organic dielectric.

3. The method of claim 1 wherein the step of forming the second dielectric layer comprises:

forming the second dielectric layer using a spin-on process wherein the second dielectric layer is a spin-on glass layer.

4. The method of claim 1 wherein the step of forming the second dielectric layer comprises:

forming an anti-reflective coating (ARC) over a portion of the second dielectric layer after the step of polishing.

5. The method of claim 1 wherein the step of forming a first conductive region and a second conductive region comprises:

forming an anti-reflective coating (ARC) over a portion of the first conductive region.

6. The method of claim 1 further comprising the step of:

forming an etch stop layer underlying an upper portion of the first conductive region.

7. The method of claim 1 wherein the step of forming a first conductive region and a second conductive region comprises:

forming an refractory metal barrier under the first conductive region.

8. The method of claim 7 wherein the step of forming a first conductive region and a second conductive region comprises:

forming the refractory metal barrier from a material selected from a group consisting of: titanium nitride, titanium tungsten, titanium, tantalum, tantalum nitride, tantalum silicon nitride, titanium silicon nitride, and tungsten nitride.

9. The method of claim 1 wherein the step of forming a first conductive region and a second conductive region comprises:

forming the first conductive region form a material selected from a group consisting of: copper, silver, gold, and aluminum.

10. The method of claim 1 wherein the step of forming the second dielectric layer comprises:

forming the second dielectric layer from a material selected from a group consisting of: HSQ, BCB, polyimide, and PAE.

11. The method of claim 1 wherein the step of polishing a top portion of the second dielectric layer comprises:

removing a top portion of the second dielectric layer by polishing a top portion of the second dielectric layer using a chemical mechanical polish process.

12. The method of claim 1 wherein the step of polishing a top portion of the second dielectric layer comprises:

removing a top portion of the second dielectric layer by etching away a top portion of the second dielectric layer using an etch chemistry.

13. The method of claim 1 wherein the step of forming the second dielectric layer comprises:

forming the second dielectric layer having a dielectric constant $\epsilon$ wherein $\epsilon \leq 3.0$.

14. The method of claim 1 wherein the step of forming the second dielectric layer comprises:

forming the second dielectric layer having a dielectric constant $\epsilon$ wherein $\epsilon \leq 2.7$.

15. The method of claim 1 wherein the step of forming a first conductive region and a second conductive region comprises:

forming the first conductive region and the second conductive region from a same dual in-laid process step.

16. The method of claim 1 wherein the step of forming a first conductive region and a second conductive region comprises:

forming the first conductive region having a low conductive contact portion and an upper conductive interconnect portion to form an in-laid metal structure.

17. The method of claim 1 further comprising:

removing the intermediate portion of the first dielectric layer using a buffered HF solution.

18. An method for forming a semiconductor device, the method comprising the steps of:

forming a first dielectric layer;

forming contact openings in first dielectric layer;

forming a second dielectric layer overlying the first dielectric layer wherein the second dielectric layer bridges the contact openings to form contact air gaps;

forming openings through the second dielectric layer to expose the contact air gaps and form interconnect trenches; and forming conductive material within the contact air gaps and the interconnect trenches to form a conductive interconnect wherein conductive material in the interconnect trenches are separated by the second dielectric layer.

19. The method of claim 18 wherein the step of forming the second dielectric layer comprises:

forming the second dielectric layer as a low dielectric constant material having a dielectric constant $\epsilon$ wherein $\epsilon \leq 3.5$.

20. The method of claim 18 wherein the step of forming the second dielectric layer comprises:

forming the second dielectric layer as a low dielectric constant material having a dielectric constant $\epsilon$ wherein $\epsilon \leq 3.0$.

21. The method of claim 18 wherein the step of forming the second dielectric layer comprises:

forming the second dielectric layer as a low dielectric constant material having a dielectric constant $\epsilon$ wherein $\epsilon \leq 2.7$.

22. The method of claim 18 further comprising the step of:

forming a capping layer overlying the conductive material.

23. The method of claim 18 wherein the step of forming a conductive material comprises:

forming an refractory metal barrier under the conductive material.

24. The method of claim 23 wherein the step of forming the conductive material comprises:

forming the refractory metal barrier from a material selected from a group consisting of: titanium nitride, titanium tungsten, titanium, tantalum, tantalum nitride, tantalum silicon nitride, titanium silicon nitride, and tungsten nitride.

25. The method of claim 18 further comprising:

forming an anti-reflective coating (ARC) layer over a top portion of the second dielectric layer.

26. The method of claim 18 further comprising:

forming an anti-reflective coating (ARC) layer under and in contact with the first dielectric layer.

27. The method of claim 18 wherein the step of forming conductive material further comprises:

forming the conductive material within the interconnects trenches wherein the conductive material within the interconnects trenches has a first width; and forming the conductive material within the contact air gaps wherein the conductive material within the contact air gaps has a second width, the second width being less than the first width.

28. The method of claim 18 wherein the step of forming a second dielectric layer comprises:

exposing the second dielectric layer to a temperature elevated above room temperature to remove solvents from the second dielectric layer.

29. The method of claim 28 wherein the step of forming a second dielectric layer comprises:

ramping the temperature from a low temperature to a high temperature above 100° C. at a selected rate wherein the selected rate substantially avoids blistering of the contact air gap.

30. The method of claim 18 wherein the step of forming a second dielectric layer comprises:

forming the second dielectric layer in a sub-atmospheric environment whereby fewer molecules or atoms are trapped within the contact air gaps.

31. The method of claim 18 wherein the step of forming the second dielectric layer comprises:

forming the second dielectric layer by a spin-on process.

32. The method of claim 31 wherein the step of forming the second dielectric layer comprises:

forming the second dielectric as a PPQ spin-on polymer.

33. The method of claim 31 wherein the step of forming the second dielectric layer comprises:

forming the second dielectric layer as a spin-on polyimide.

34. The method of claim 31 wherein the step of forming the second dielectric layer comprises:

forming the second dielectric layer as a spin-on polyimide selected from a group consisting of: poly (amic) acid solution and fully imidized polyimide.

35. An method for forming a semiconductor device, the method comprising the steps of:

forming a plurality of separated conductive members wherein adjacent separated conductive members in the plurality of separated conductive members are separated by gaps; and forming a first dielectric layer, via a spin-on process, overlying the plurality of separated conductive members whereby at least one of the gaps is bridged by the first dielectric layer to form at least one air region, wherein the at least one air region has a dielectric constant less than 2.0 and improves isolation between at least two separated conductive members in the plurality of separated conductive members wherein the first dielectric layer is selected from a group consisting of: a spin-on polyimide material, a PPQ spin-on polymer, and a material selected from a group consisting of poly(amic) acid solution and fully imidized polyimide.

36. The method of claim 35 wherein the step of forming a first dielectric layer comprises:

forming the first dielectric layer in a sub-atmospheric environment.

37. The method of claim 35 wherein the step of forming a first dielectric layer comprises:

annealing the first dielectric layer using an anneal process within the temperature range of 100° C. to 250° C. after formation of the first dielectric layer.

38. The method of claim 35 further comprising:

forming at least a portion of the plurality of separated conductive members as an inlaid copper interconnect structure.

39. The method of claim 35 further comprising the step of:

forming a second dielectric layer over the plurality of separated conductive members wherein the first dielectric layer is formed overlying the second dielectric layer.

40. The method of claim 39 further comprising the step of:

etching the second dielectric layer to form sidewall spacers laterally adjacent the plurality of separated conductive members.

41. The method of claim 35 wherein the step of forming a first dielectric layer comprises:

forming the first dielectric layer such that the first dielectric layer fills other gaps between the plurality of separated conductive members while not filling in the at least one air region since the other gaps have widths larger than a width of the at least one air region.

42. The method of claim 35 further comprising:

forming a second dielectric layer overlying the first dielectric layer.

43. The method of claim 42 further comprising:

planarizing the second dielectric layer so that the composite layer comprising the first and second dielectric layer made substantially planar.

44. A method for forming an integrated circuit structure comprising the steps of:

providing a semiconductor substrate;

forming a first dielectric layer overlying the semiconductor substrate;

forming a plurality of conductive members overlying the first dielectric layer, wherein the plurality of conductive members are separated by a first distance X;

depositing a nonconformal dielectric layer overlying the plurality of conductive member, wherein the nonconformal dielectric layer is deposited using plasma enhanced chemical vapor deposition and forms a sealed void region between at least two of the conductive members in the plurality of conductive members, the sealed void region spanning at least 50 percent of the first distance X; and forming a second dielectric layer, the second dielectric layer overlying the sealed void region and the nonconformal dielectric layer.

45. The method of claim 44, wherein the step of depositing the nonconformal dielectric layer, the sealed void region is further characterized as spanning at least 60 percent of the first distance.

46. The method of claim 45, wherein the step of depositing the nonconformal dielectric layer, the sealed void region is further characterized as spanning at least 70 percent of the first distance.

47. The method of claim 46, wherein the step of depositing the nonconformal dielectric layer, the sealed void region is further characterized as spanning at least 80 percent of the first distance.

48. The method of claim 47, wherein the step of depositing the nonconformal dielectric layer, the sealed void region is further characterized as spanning at least 90 percent of the first distance.

49. The method of claim 48, wherein the step of depositing the nonconformal dielectric layer is further characterized as depositing the nonconformal dielectric layer using silane as a source gas.

50. An method for forming a semiconductor device, the method comprising the steps of:

forming a plurality of separated conductive members wherein adjacent separated conductive members in the plurality of separated conductive members are separated by gaps;

forming a second dielectric layer over the plurality of separated conductive members;

etching the second dielectric layer to form sidewall spacers laterally adjacent the plurality of separated conductive members; and forming a first dielectric layer, via a spin-on process, overlying the second dielectric layer and the plurality of separated conductive member whereby at least one of the gaps is bridged by the first dielectric layer to form at least one air region, wherein the at least one air region has a dielectric constant less than 2.0 and improves isolation between at least two separated conductive members in the plurality of separated conductive members.

* * * * *